US006215164B1

(12) United States Patent
Cao et al.

(10) Patent No.: US 6,215,164 B1
(45) Date of Patent: *Apr. 10, 2001

(54) ELEVATED IMAGE SENSOR ARRAY WHICH INCLUDES ISOLATION BETWEEN UNIQUELY SHAPED IMAGE SENSORS

(75) Inventors: Min Cao; Jeremy A Theil; Gary W Ray, all of Mountain View; Dietrich W Vook, Menlo Park; Shawming Ma, Sunnyvale, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/361,342

(22) Filed: Jul. 26, 1999

(51) Int. Cl.$^7$ .................................................. A01L 27/14
(52) U.S. Cl. .................... 257/431; 257/430; 257/431; 257/434; 257/440; 257/444
(58) Field of Search .................................... 257/431, 434, 257/440, 444, 430

(56) References Cited

U.S. PATENT DOCUMENTS

| 4,943,710 | * | 7/1990 | Sakama et al. | 250/208.1 |
| 5,076,670 | * | 12/1991 | Sayyah | 359/72 |
| 5,667,597 | * | 9/1997 | Ishihara | 136/258 |
| 5,834,822 | * | 11/1998 | Hatanaka et al. | 257/431 |
| 5,962,844 | * | 10/1999 | Merrill et al. | 250/214 |
| 5,998,794 | * | 12/1999 | Spivey et al. | 250/370.09 |
| 6,018,187 | * | 1/2000 | Theil et al. | 257/458 |

FOREIGN PATENT DOCUMENTS

| 360198858 | * | 6/1993 | (JP) | 257/444 |
| 405152553 | * | 6/1993 | (JP) | 257/431 |
| 405175539 | * | 7/1993 | (JP) | 257/431 |
| 405183184 | * | 7/1993 | (JP) | 257/431 |
| 405283670 | * | 10/1993 | (JP) | 257/431 |
| 406045568 | * | 2/1994 | (JP) | 257/431 |

* cited by examiner

*Primary Examiner*—Eddie C. Lee
*Assistant Examiner*—Edgardo Ortiz
(74) *Attorney, Agent, or Firm*—Brian R. Short

(57) ABSTRACT

An image pixel sensor array. The image pixel sensor array includes a substrate. An interconnect structure is formed adjacent to the substrate. A plurality of image pixel sensors are formed adjacent to the interconnect structure. Each image pixel sensor includes a pixel electrode, and an I-layer formed adjacent to the pixel electrode. The I-layer includes a first surface adjacent to the pixel electrode, and a second surface opposite the first surface. The first surface includes a first surface area which is less than a second surface area of the second surface. The image pixel sensor array further includes an insulating material between each image pixel sensor, and a transparent electrode formed over the image pixel sensors. The transparent electrode electrically connects the image pixel sensors and the interconnect structure.

16 Claims, 4 Drawing Sheets

ELEVATED IMAGE SENSOR ARRAY WHICH INCLUDES ISOLATION BETWEEN UNIQUELY SHAPED IMAGE SENSORS

FIELD OF INVENTION

This invention relates generally to PIN photo diode image sensors. In particular, it relates to an array of elevated PIN diode image sensor in which each diode image sensor is isolated from other diode image sensors, and in which the diode image sensors include a uniquely shaped structure.

BACKGROUND

An array of image sensors or light sensitive sensors detect the intensity of light received by the image sensors. The image sensors typically generate electronic signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

FIG. 1 shows a cross-section of a prior art array of image sensors. This array of image sensors includes PIN diode sensors located over a substrate 10. An interconnection structure 12 electrically connects an N-layer 14 of the PIN diodes to the substrate 10. An I-layer 16 is formed over the N-layer 14. A P-layer 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A transparent conductive layer 24 is located over the array of diode sensors. A conductive lead 26 is connected to the transparent conductive layer 24. The conductive lead 26 is connected to a bias voltage which allows biasing of the P-layer 18 of the array of PIN diode sensors to a selected voltage potential.

A limitation of the image sensor structure of FIG. 1 is that the individual image sensors are not isolated from each other. That is, light received by a given image sensor will effect neighboring image sensors because current can flow through the N-layer 14 between neighboring image sensors. Charge can flow between the image sensors especially when the light intensity of the received light varies greatly between neighboring image sensors. The P-layer 18, the I-layer 16 and the N-layer 14 are shared by neighboring image sensors. A trench 28 is formed to provide some isolation between the image sensors by increasing the resistance between the N-layers sections of neighboring image sensors.

Another limitation of the image sensor structure of FIG. 1 is the electrical connection between the conductive lead 26 and the transparent conductive layer 24. The transparent conductive layer 24 must be electrically conductive to allow biasing of the PIN diodes, and must be transparent to allow the PIN diodes to receive light. Generally, it is very difficult to bond to the types of materials that must be used to form the transparent conductive layer 24. Therefore, the conductive lead 26 must be attached to the transparent conductive layer 24 with the aid of some type of clamp or support structure. The result being an electrical connection which is not reliable and which is expensive to produce.

It is desirable to have a plurality of active pixel sensors formed adjacent to a substrate in which the pixel sensors are isolated from each other to reduce coupling between the pixel sensors.

SUMMARY OF THE INVENTION

The invention includes a plurality of image pixel sensors formed adjacent to a substrate. A transparent conductive layer is reliably electrically connected between the image pixel sensors and to a image pixel sensor bias voltage which originates on the substrate. The image pixel sensors are isolated from each other which reduces coupling between the image pixel sensors.

A first embodiment includes an image pixel sensor array. The image pixel sensor array includes a substrate. An interconnect structure is formed adjacent to the substrate. A plurality of image pixel sensors are formed adjacent to the interconnect structure. Each image pixel sensor includes a pixel electrode, and an I-layer formed adjacent to the pixel electrode. The I-layer includes a first surface adjacent to the pixel electrode, and a second surface opposite the first surface. The first surface includes a first surface area which is less than a second surface area of the second surface. The image pixel sensor array further includes an insulating material between each image pixel sensor, and a transparent electrode formed over the image pixel sensors. The transparent electrode electrically connects the image pixel sensors and the interconnect structure.

A second embodiment is similar to the first embodiment. Each image pixel sensor of the second embodiment includes a separate P-layer section formed adjacent to the I-layer.

A third embodiment is similar to the first embodiment. Each image pixel sensor of the second embodiment includes a P-layer wherein the P-layer extends adjacently to a plurality of separate I-layers.

A fourth embodiment is similar to the first embodiment. The second embodiment includes the each pixel electrode consisting of an N-layer.

A fifth embodiment is similar to the first embodiment. The third embodiment includes the I-layer sections and the pixel electrodes consisting of amorphous silicon.

Other aspects and advantages of the present invention will become apparent from the following detailed description, taken in conjunction with the accompanying drawings, illustrating by way of example the principles of the invention.

DETAILED DESCRIPTION

Figure 1:
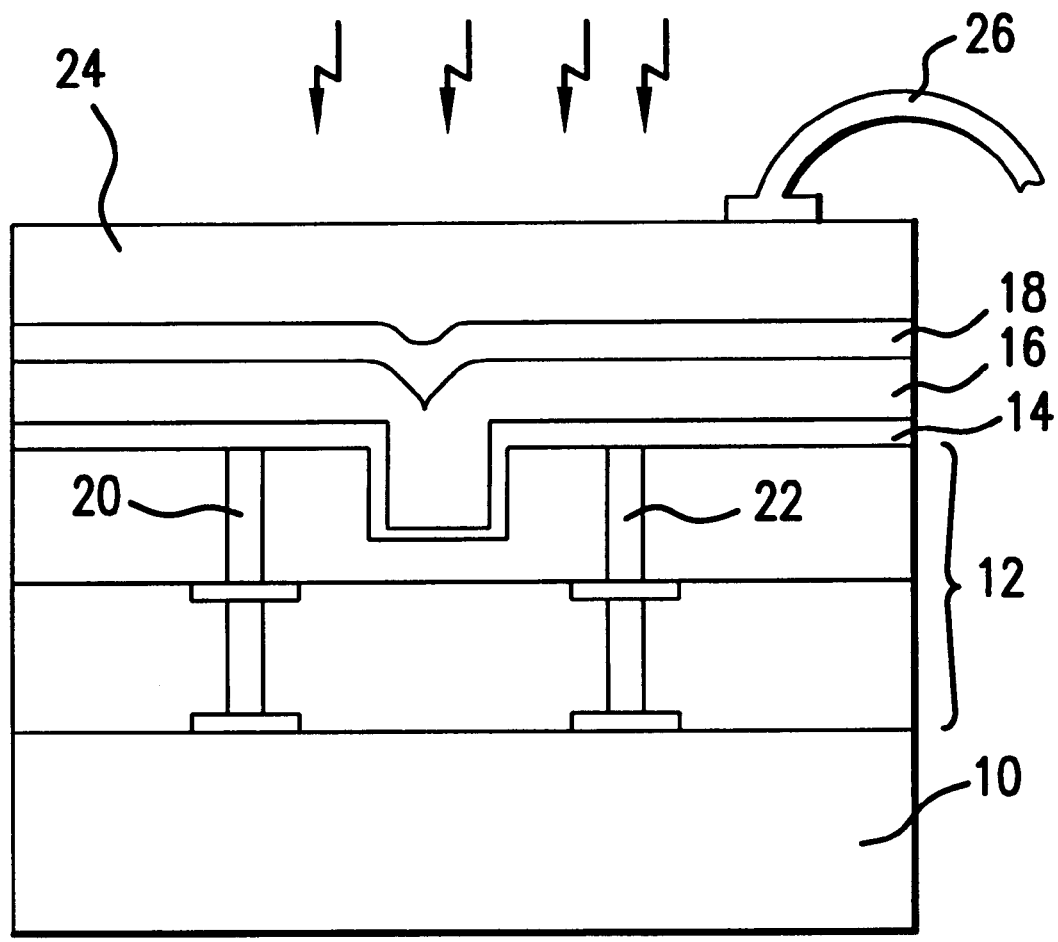
FIG. 1 shows a cross-section of a prior art array of image pixel sensors.

As shown in the drawings for purposes of illustration, the invention is embodied in an elevated image pixel sensor array adjacent to a substrate which includes isolation between the image pixel sensors. The image pixel sensors are uniquely shaped to make the image pixel sensors easier to form. The unique shape also enhances the absorption efficiency of the image pixel sensors for certain wavelengths of light.

Figure 2:
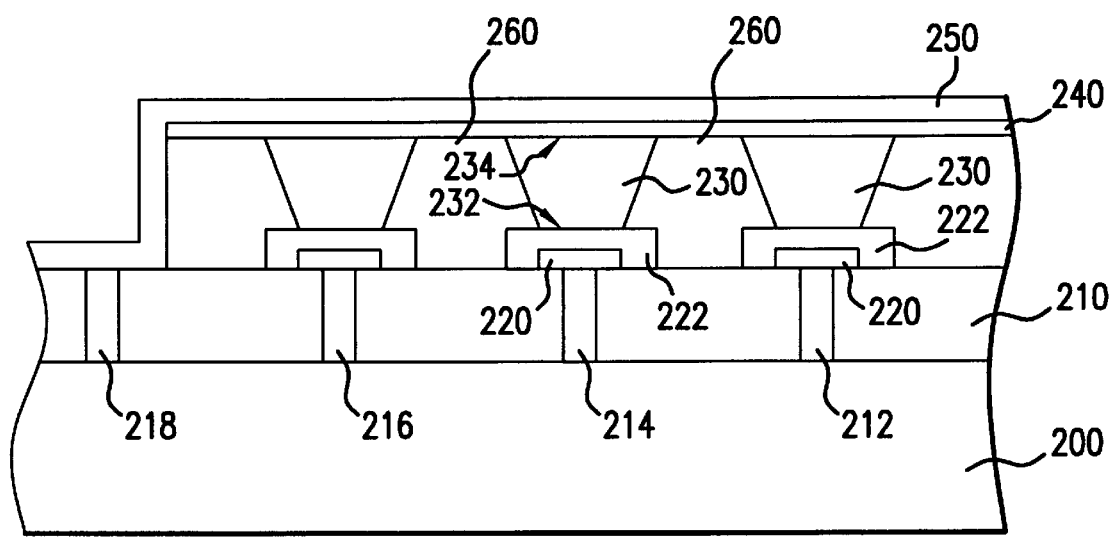
FIG. 2 shows an embodiment of the invention.

FIG. 2 shows a first embodiment of the invention. This embodiment includes a substrate 200. An interconnection structure 210 is formed adjacent to the substrate 200. Inner metal sections 220 and pixel electrodes 222 are formed adjacent to the interconnection structure 210. I-layer sections 230 are adjacent to the pixel electrodes 222. A P-layer 240 is adjacent to the I-layer sections 230. Each image pixel sensor of an array of image pixel sensors includes an individual inner metal section 220, a pixel electrode 222 and an I-layer section 230. The P-layer 240 is adjacent to a plurality of I-layer sections 230. A transparent conductor 250 (also referred to as a transparent electrode) is formed adjacent to the P-layer 240. Insulating regions 260 are located between the image pixel sensors. The pixel electrode 222 of a first image pixel sensor is electrically connected to the substrate 200 through a first conductive via 212. The pixel electrode 222 of a second image pixel sensor is electrically connected to the substrate 200 through a second conductive via 214. The pixel electrode 222 of a third image pixel sensor is electrically connected to the substrate 200 through a third conductive via 216. An inner surface of the transparent conductor 250 is electrically connected to the substrate 200 through a fourth conductive via 218.

As shown in FIG. 2, an inner surface 232 of the I-layer sections 230 is smaller than an outer surface 234 of the I-layer sections. That is, the surface area of the inner surface 232 is smaller than the surface area of the outer surface 234. The result is that the I-layer sections 230 include sloped sidewalls.

The sloped sidewalls provide several benefits. The sloped sidewalls allow for better step coverage when depositing the I-layer sections 230 between the etched insulating regions 260. If the sidewalls of the I-layer sections 230 were not sloped, deposition of the I-layer sections over the pixel electrodes 222 would be more difficult because of "tight" corners between the insulating regions 260 and the pixel electrodes 222. The sloped sidewalls provide for gradual corners that can more easily be filled with a deposited material.

The sloped sidewalls also allow the I-layer sections to be wider at the outer surface 234. The outer surface 234 is closer to where the image pixel sensor receive light. This allows certain wavelengths of light (generally blue-green) to be more efficiently absorbed at the outer surface 234. In some applications, efficient absorption of blue-green light is desirable.

The image pixel sensors conduct charge when the image pixel sensors receive light. The substrate 200 generally includes sense circuitry and signal processing circuitry. The sense circuitry senses how much charge the image pixel sensors have conducted. The amount of charge conducted represents the intensity of light received by the image pixel sensors. Generally, the substrate 200 can be CMOS (complementary metal oxide silicon), BiCMOS or Bipolar. The substrate 200 can include various types of substrate technology including charged coupled devices.

Typically, the interconnection structure 210 is a standard CMOS interconnection structure. The structure and methods of forming this interconnection structure are well known in the field of electronic integrated circuit fabrication. The interconnection structure 210 can be a subtractive metal structure, or a single or dual damascene structure.

The conductive vias 212, 214, 216, 218 pass through the interconnection structure 210 and electrically connect the pixel electrodes 222 to the substrate 200. Typically, the conductive vias 212, 214, 216, 218 are formed from tungsten. Tungsten is generally used during fabrication because tungsten can fill high aspect ratio holes. That is, tungsten can be used to form narrow and relatively long interconnections. Typically, the conductive vias interconnection structure 210 are formed using a chemical vapor deposition (CVD) process. Other materials which can be used to form the conductive vias 212, 214, 216, 218 include copper, aluminum or any other electrically conductive material.

The inner metal sections 220 should include a thin conductive material. The inner metal sections 220 may be formed, for example, from a degenerately doped semiconductor layer, aluminum, titanium, titanium nitride, copper or tungsten. The inner metal sections 220 should be thin (approximately 500 Angstroms) and smooth. The inner metal sections 220 should be smooth enough that any surface roughness is substantially less than the thickness of the pixel electrodes 222 formed over the inner metal sections 220. To satisfy the smoothness requirement, polishing of the inner metal sections 220 may be required.

The inner metal sections 220 can be optional. However, the inner metal sections 220 have a lower resistance than the materials used to form the pixel electrodes 222. Therefore, the inner metal sections 220 provide better current collection.

The pixel electrodes 222 are generally formed from a doped semiconductor. The doped semiconductor can be an N-layer of amorphous silicon. The pixel electrodes must be thick enough, and doped heavily enough that the pixel electrodes 222 do not fully deplete when biased during operation. The pixel electrodes 222 are typically doped with phosphorous.

The pixel electrodes 222 are typically deposited using plasma etched chemical vapor deposition (PECVD). A silicon containing gas (such as $Si_2H_6$ or $SiH_4$) is included when forming amorphous silicon pixel electrodes. When forming N-layer pixel electrodes, the PECVD process is performed with a phosphorous containing gas (such as $PH_3$).

An N-layer of amorphous silicon is typically used when forming PIN diode image pixel sensors. However, the diode image pixel sensors can include an NIP sensor configuration. In this case, the pixel electrodes 222 are formed from P-layers, and the P-layer 240 of FIG. 2 is replaced with an N-layer.

The I-layer sections 230 are generally formed from hydrogenated amorphous silicon. The I-layer sections 230 can be deposited using a PECVD process or a reactive sputtering process. The PECVD process must include a silicon containing gas. The deposition should be at a low enough temperature that hydrogen is retained within the film. Typically, the I-layer sections 230 must be chemically mechanically polished (CMP) after being deposited. The I-layer sections 230 typically are on the order of one micron thick. As previously mentioned, the I-layer sections 230 include sloped sidewalls.

The P-layer 240 is generally formed from amorphous silicon. Typically, the P-layer 240 is doped with Boron.

The P-layer 240 can deposited using a PECVD process. The PECVD process is performed with a Boron containing gas. The Boron containing gas can be $B_2H_6$. A silicon containing gas is included when forming amorphous silicon P-layer 240. The thickness of the P-layer 240 must generally be controlled to ensure that the P-layer 240 does not absorb too much short wavelength (blue) light.

The insulating regions 260 provide isolation between the image pixel sensors formed by the pixel electrodes 222, the I-layer sections 230 and the P-layer 240. That is, the insulating regions 260 provide isolation between the image pixel sensors. The insulating regions 260 are typically formed from $SiO_2$, $Si_3N_4$ or a combination of $SiO_2$ and $Si_3N_4$.

As previously described, the pixel electrodes 222, the I-layer sections 230 and the P-layer 240 are generally formed from amorphous silicon. However, the pixel electrodes 222, the I-layer sections 230 and the P-layer 240 can also be formed from amorphous carbon, amorphous silicon carbide, amorphous germanium, or amorphous silicon-germanium. It should be understood that this list is not exhaustive.

As will be described later, the I-layer sections 230 and the P-layer 240 are formed by depositing the I-layer sections 230 and the P-layer 240 within trenches formed within an insulating layer. The trenches having sloped sidewalls can be formed by isotropically etching the insulating layer. The non-etched regions of the insulating layer form the insulating regions 260.

The transparent conductor 250 provides a conductive connection between the P-layer 240 and the interconnection structure 210 through the fourth conductive via 218. Light must pass through the transparent conductor 250 which is received by the image pixel sensors. Generally, the transparent conductor 250 is formed from an indium tin oxide. However, the transparent conductor 250 can also be formed from titanium nitride, thin silicide, or certain types of transition metal nitrides or oxides.

Both the selection of the type of material to be used within the transparent conductor 250, and the determination of the desired thickness of the transparent conductor 250, are based upon minimizing the optical reflection of light received by the image pixel sensor. Minimization of the reflection of light received by the image pixel sensor helps to optimize the amount of light detected by the image pixel sensor.

The transparent conductor 250 can be deposited by a sputtering process. Deposition through sputtering is well known in the art of integrated circuit fabrication.

A protective layer may be formed over the transparent conductor 250. The protective layer provides mechanical protection, electrical insulation, and can provide some anti-reflective characteristics.

Figure 3:
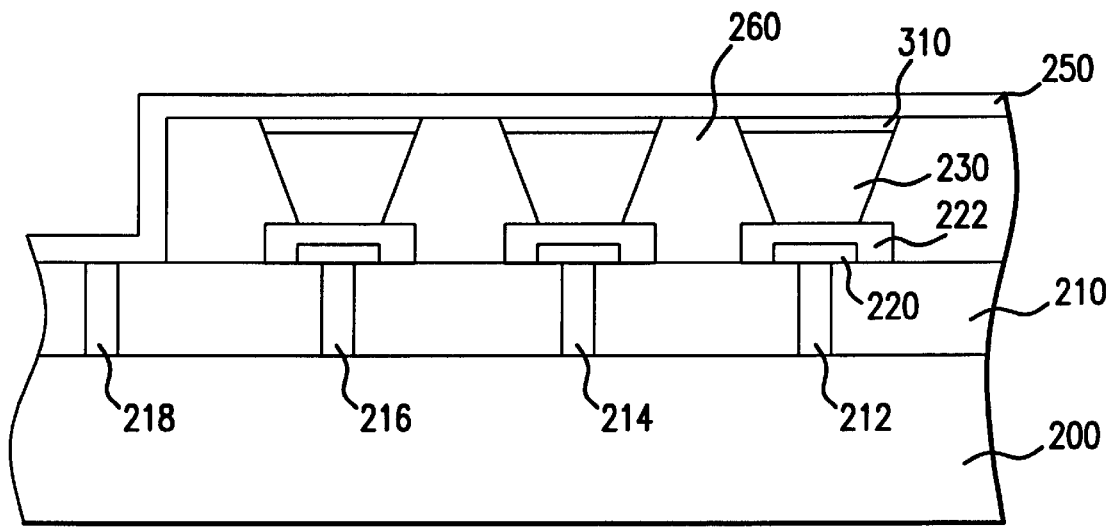
FIG. 3 shows another embodiment of the invention.

FIG. 3 shows another embodiment of the invention. For this embodiment, rather than a single P-layer 240 being formed adjacent to the I-layer sections 230 of a plurality of image pixel sensors of the array of image pixel sensors, each image pixel sensor includes an individual P-layer section 310. That is, each PIN diode sensor image pixel sensors includes a corresponding P-layer section 310.

The formation of the plurality of P-layer sections 310 rather than a single P-layer 240, provides a less uniform surface for the transparent conductor 250 to adhere. That is, the transparent conductor 250 must adhere to the P-layer sections 310 and the insulating regions 260, rather than to a single uniform P-layer 240.

FIGS. 4–7 show processing steps which can be used to fabricate the embodiments shown in FIG. 2 and FIG. 3.

Figure 4:
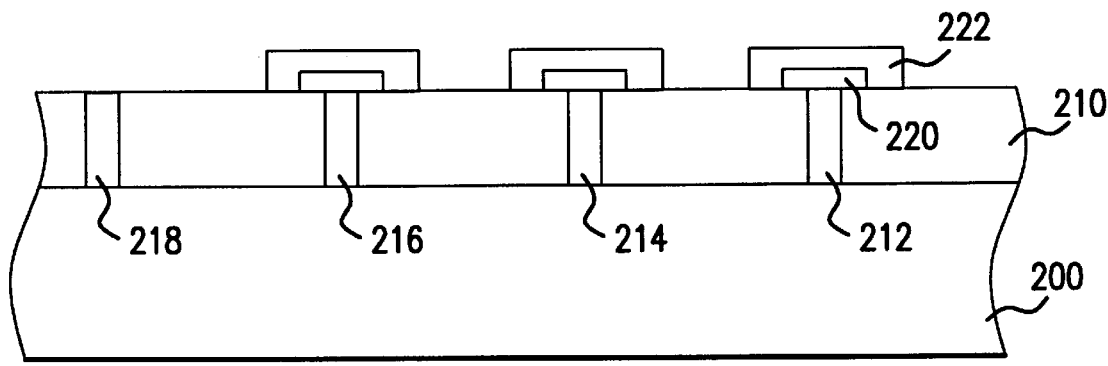
FIG. 4 shows a substrate, a standard interconnection structure, inner metal layers and pixel electrode layers, formed over the substrate.

FIG. 4 shows a substrate, a standard interconnection structure, inner metal layers and pixel electrode layers, formed over the substrate.

As previously mentioned, the substrate 200 can be CMOS (complementary metal oxide silicon), BiCMOS or Bipolar. The substrate 200 can include various types of substrate technology including charged coupled devices.

The structure and methods of forming this interconnection structure 210 are well known in the field of electronic integrated circuit fabrication. The interconnection structure 210 can be a subtractive metal structure, or a single or dual damascene structure.

The inner metal sections 220 are formed by depositing an inner metal layer over the interconnection structure 210. The inner metal layer is then lithographically etched forming the inner metal sections 220 over the conductive vias 212, 214, 216 of the interconnection structure 210. The inner metal layer is typically deposited by a sputtering process.

The pixel electrodes 222 are formed by depositing an electrode layer. The electrode layer is then lithographically etched forming the pixel electrodes 222 over the inner metal sections 220. The electrode layer is typically deposited using a PECVD process. The PECVD process is performed with a phosphorous containing gas. The phosphorous containing gas can be $PH_3$. A silicon containing gas, such as $Si_2H_6$ or $SiH_4$, is included when forming amorphous silicon pixel electrodes 222.

Figure 5:
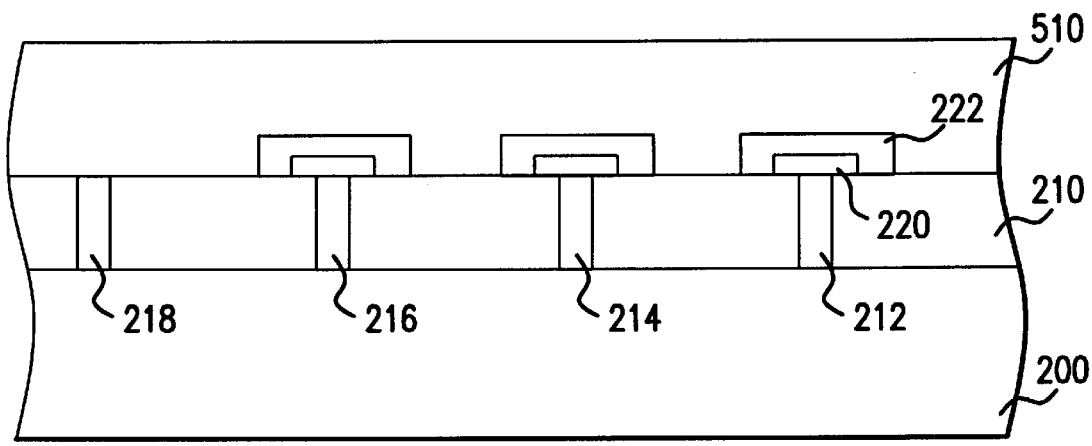
FIG. 5 shows the deposition of an insulating layer over the standard interconnection structure and the pixel electrode layers of FIG. 4.

FIG. 5 shows the deposition of an insulating layer 510 over the standard interconnection structure and the pixel electrode layers of FIG. 4.

The insulating layer 510 is deposited by a PECVD process. The insulating layer 510 is typically formed from $SiO_2$, $Si_3N_4$ or a combination of $SiO_2$ and $Si_3N_4$. The insulating layer 510 fills in gaps between the image pixel sensors and is used to form the insulating regions 260.

Figure 6:
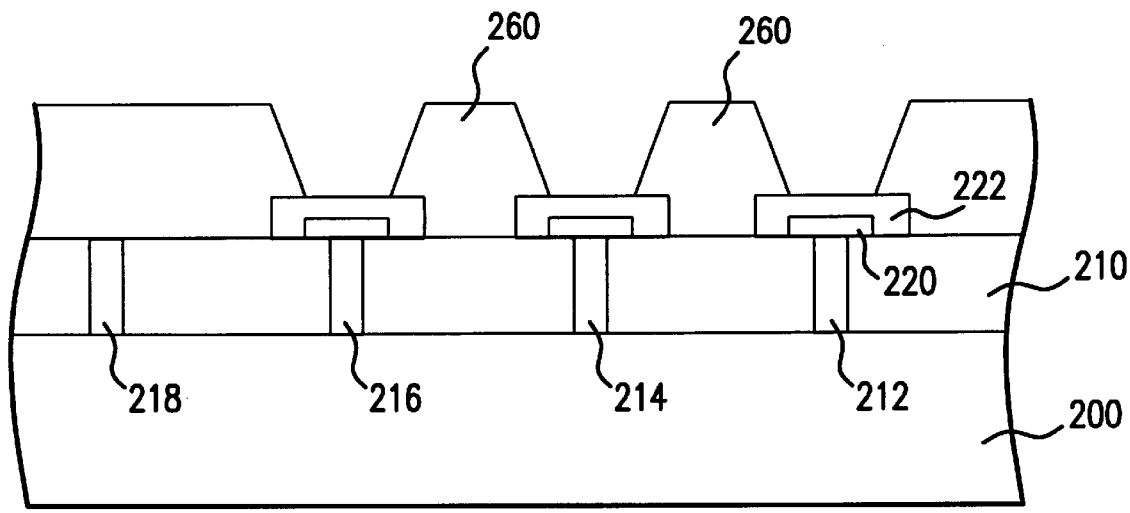
FIG. 6 shows the insulating layer having been etched forming trenches over the pixel electrode layers.

FIG. 6 shows the insulating layer 510 having been wet or dry etched forming trenches over the pixel electrode layers. The remaining portion of the insulating layer forms the insulating regions 260. Typically, material is removed by an anisotropic plasma etch which forms vertically straight, non-sloped sidewalls. However, the trenches of the invention are sloped which can be formed by an isotropic wet or dry etch. The formation of sloped sidewall trenches within oxide layers is well known in the art of semiconductor processing.

Figure 7:
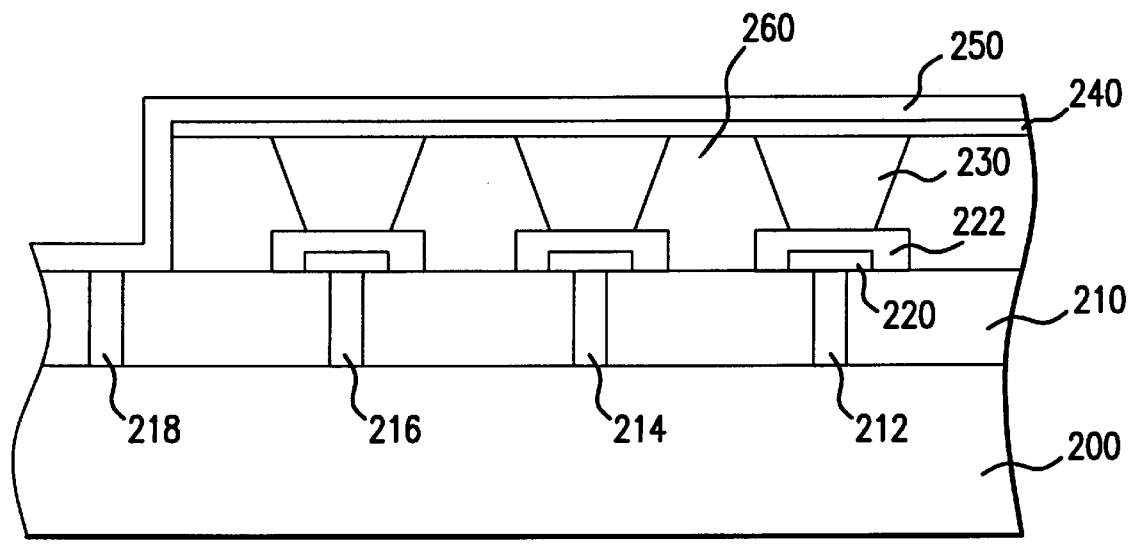
FIG. 7 shows I-layers, a P-layer and a transparent conductive layer having been deposited over the etched insulating layer forming an image pixel sensor array.

FIG. 7 shows I-layer sections 230, a P-layer 240 and a transparent conductive layer 250 having been deposited over the etched insulating layer forming an image pixel sensor array.

The I-layer sections 230 are generally deposited using a PECVD process or reactive sputtering process. The PECVD process must include a silicon containing gas. The deposition should be at a low enough temperature that hydrogen is retained within the film. As previously mentioned, the I-layer sections 230 are typically chemically mechanically polished (CMP) after being deposited within the trenches of the etched insulating layer.

The P-layer 240 can also be deposited using a PECVD process. The PECVD process is performed with a Boron containing gas. The Boron containing gas can be $B_2H_6$. A silicon containing gas is included when forming an amorphous silicon P-layer 66.

The embodiment of the invention shown in FIG. 3 can be formed by depositing the I-layer sections 230 so that the I-layer sections only fill a portion of the trenches of the etched insulating layer. The P-layer sections 310 are then deposited within the remaining portion of the trenches which have not been filled by the I-layer sections 230. The P-layer sections 310 are typically chemically mechanically polished (CMP) after being deposited within the trenches of the etched insulating layer.

Generally, the transparent conductor 250 is formed from an indium tin oxide. However, the transparent conductor 250 can also be formed from titanium nitride, thin silicide, or certain types of transition metal nitrides or oxides.

The insulating layer and the P-layer 240 are etched to provide access to the fourth conductive via 218 before the transparent conductor is deposited.

The transparent conductor 250 is generally deposited through reactive sputtering. However, the transparent conductor 250 can also be grown by evaporation. If the transparent conductor 250 is formed from titanium nitride, then typically a CVD process or a sputtering process must be used to deposit the transparent conductor 250.

As stated previously, a protective layer may be formed over the transparent conductor 250. The protective layer provides mechanical protection, electrical insulation, and can provide some anti-reflective characteristics.

Although specific embodiments of the invention have been described and illustrated, the invention is not to be limited to the specific forms or arrangements of parts so described and illustrated. The invention is limited only by the claims.

What is claimed:

1. An image pixel sensor array comprising:
    a substrate comprising electronic circuitry;
    an interconnect structure adjacent to the substrate;
    a plurality of image pixel sensors formed adjacent to the interconnect structure, each image pixel sensor comprising:
        a pixel electrode;
        an I-layer, the I-layer comprising a first surface adjacent to the pixel electrode, a second surface opposite the first surface, the first surface having a first surface area which is less than a second surface area of the second surface;
    the image pixel sensor array further comprising:
        an insulating material between each image pixel sensor; and
        a transparent electrode formed over the image pixel sensors, the transparent electrode electrically connected to the image pixel sensors and the interconnect structure.

2. The image pixel sensor array as recited in claim 1, wherein each image pixel sensor further comprises a separate P-layer section formed adjacent to the I-layer.

3. The image pixel sensor array as recited in claim 1, wherein each image pixel sensor further comprises a P-layer, wherein the P-layer extends adjacently to a plurality of separate I-layers.

4. The image pixel sensor array as recited in claim 1, wherein each pixel electrode comprises an N-layer.

5. The image pixel sensor array as recited in claim 1, wherein the interconnect structure electrically interconnects the pixel electrodes to the substrate.

6. The image pixel sensor array as recited in claim 1, wherein the I-layer sections and the pixel electrodes comprise amorphous silicon.

7. The image pixel sensor array as recited in claim 2, wherein each P-layer section comprises amorphous silicon.

8. The image pixel sensor array as recited in claim 3, wherein the P-layer comprises amorphous silicon.

9. The image pixel sensor array as recited in claim 1, wherein the inner surface of the transparent electrode is electrically connected to the interconnect structure through a tungsten plug.

10. The image pixel sensor array as recited in claim 1, wherein the transparent electrode comprises indium tin oxide.

11. The image pixel sensor array as recited in claim 1, wherein the substrate comprises CMOS.

12. The image pixel sensor array as recited in claim 1, wherein the substrate comprises active circuits which sense charge accumulated by the image pixel sensors due to the image pixel sensors receiving light.

13. The image pixel sensor array as recited in claim 1, wherein the substrate comprises charge coupled devices.

14. The image pixel sensor array as recited in claim 1, wherein each pixel electrode comprises a P-layer.

15. The image pixel sensor array as recited in claim 14, wherein each image pixel sensor further comprises a separate N-layer section formed adjacent to the I-layer.

16. The image pixel sensor array as recited in claim 14, wherein each image pixel sensor further comprises a N-layer wherein the N-layer extends adjacently to a plurality of separate I-layers.

* * * * *